(12) United States Patent
Murray et al.

(10) Patent No.: US 7,446,040 B2
(45) Date of Patent: Nov. 4, 2008

(54) STRUCTURE FOR OPTIMIZING FILL IN SEMICONDUCTOR FEATURES DEPOSITED BY ELECTROPLATING

(75) Inventors: Conal E. Murray, Yorktown Heights, NY (US); Philippe M. Vereecken, Leuven (BE)

(73) Assignee: International Business Machines Corporation, Armonk, NY (US)

( * ) Notice: Subject to any disclaimer, the term of this patent is extended or adjusted under 35 U.S.C. 154(b) by 473 days.

(21) Appl. No.: 11/330,537

(22) Filed: Jan. 12, 2006

(65) Prior Publication Data

US 2007/0161239 A1     Jul. 12, 2007

(51) Int. Cl.
*H01L 21/44* (2006.01)

(52) U.S. Cl. .................. 438/678; 438/638; 438/687

(58) Field of Classification Search ............... 438/618, 438/622, 638, 653, 666, 668, 678, 687
See application file for complete search history.

(56) References Cited

U.S. PATENT DOCUMENTS

| 6,245,676 | B1* | 6/2001 | Ueno | 438/687 |
| 6,620,726 | B1* | 9/2003 | Preusse et al. | 438/633 |
| 6,908,807 | B2* | 6/2005 | Rueger | 438/221 |

* cited by examiner

*Primary Examiner*—Kevin M Picardat
(74) *Attorney, Agent, or Firm*—Connolly Bove Lodge & Hutz LLP; Robert M. Trepp

(57) ABSTRACT

A structure and process are provided that are capable of reducing the occurrence of discontinuities within the metallization, such as voiding or seams, formed during electroplating at the edges of semiconductor metallization arrays. The structure includes a metallization bar located around the periphery of the array. The process employs the structure during electroplating.

1 Claim, 2 Drawing Sheets

STRUCTURE FOR OPTIMIZING FILL IN SEMICONDUCTOR FEATURES DEPOSITED BY ELECTROPLATING

TECHNICAL FIELD

The present disclosure relates generally to a new structure as well as to a new process which reduces the occurrence of discontinuities within the metallization, such as voiding or seams, at the edges of semiconductor metallization arrays. The structure comprises a metallization bar that is placed around the periphery of the semiconductor array. The process employs the structure during the electroplating of the array.

BACKGROUND

During the manufacture of semiconductor technology, films of various materials are sequentially deposited and patterned on a semiconductor substrate such as a silicon substrate. For the back-end-of-line (BEOL) processing, these materials include metallization levels for the interconnect structures, dielectric levels used for insulation and capping, and barrier layers to prevent diffusion and oxidation of the interconnects. The current choice for interconnect metallization is copper, manufactured in a dual-damascene method. Dielectric materials include silicon oxide, deposited by the plasma enhanced chemical vapor deposition (PECVD) using silane ($SiH_4$) or tetraethylorthosilicate (TEOS) precursors, or organosilicate glass or borophosphosilicate glass (BPSG), deposited by chemical vapor deposition (CVD) for high-performance interconnect applications. The organosilicate glass can be in its dense form or in a form that includes porosity.

The choice of barrier layers includes tantalum, tantalum nitride, tungsten nitride, ruthenium and titanium and alloys of these metals.

The current deposition method for the copper metallization process involves electroplating of the copper either onto a conductive seed layer or directly onto the barrier layer materials. An applied current or voltage is placed on the patterned wafer in the presence of an electrochemical plating bath containing copper ions. As the aspect ratios of semiconductor metallization features increases, the ability to completely fill these features by electroplating becomes more difficult. Voids or seams can occur in semiconductor metallization trenches, leading to interconnect structures with higher resistivity and often higher susceptibility to reliability failures (such as electromigration).

FIG. 1 depicts the edge of a typical semiconductor array of fine line features in cross-section. These features consist of copper (101) electroplated either onto a conductive seed layer or directly onto the barrier layer material (102). The lines are separated by dielectric material (103), such as silicon oxide deposited by PECVD or organosilicate glass deposited by CVD. Although the plating characteristics have been optimized for plating across the entire wafer, local non-uniformities in the electrochemical potential at the edges of such arrays can cause voids (104) or seams to form in the features.

By altering the chemical composition in the plating bath, through additives that provide differential kinetics of copper plating at the flat wafer surface and in the inlaid features, one can optimize the deposition to minimize the occurrence of voiding. In addition, one can reduce the occurrence of voids and seams by tailoring the current which is applied to the wafer during plating. Along these lines see Andricacos et al., US patent application publication 2004/0069648 A1. Although these techniques can be used to minimize the onset of voids over the entire wafer, the local uniformity of the fill of semiconductor features may vary so that edges of interconnect arrays can be more susceptible to voiding issues. This is due to the lower fraction of metal present at the edge of such arrays, which alters the current distribution relative to that at the center of the arrays. Because the copper progression front works from the wafer edge (in contact with one of the electrodes) towards the wafer center, voiding issues are more likely to be observed at the side of any metallization array which is closest the wafer edge, and less so at the side of the array closest to the wafer center.

A method that can provide more uniform reduction in voiding or seams across entire microcircuitry arrays on a chip without significantly altering the plating conditions (chemistry and plating current) which are optimized for plating across the wafer would be desirable.

SUMMARY

The present disclosure makes it possible to reduce the occurrence of occurrence of discontinuities within the metallization, such as voiding or seams, during electroplating at the edges of semiconductor metallization arrays.

In particular, one aspect of the present disclosure relates to a structure capable of reducing the occurrence of discontinuities within the metallization, such as voiding or seams, during electroplating at the edges of semiconductor arrays which comprises a substrate having a semiconductor array comprising conductive lines and a metallization bar located around the periphery of the array and dielectric material located between the metallization bar and semiconductor array to form a gap between the bar and array.

Another aspect of the present disclosure relates to a method for electroplating an array of electrically conductive material comprising conductive lines onto a conductive seed layer or directly onto a platable resistive metal barrier layer located on a substrate which comprises:

plating a metallization bar on the substrate around the periphery of where the array of electrically conductive material is to be located;

contacting the substrate with a plating bath that optionally comprises a super filling additive and a suppressor, applying a current or voltage across electrodes, wherein the substrate acts as one electrode and a conductor acts as a counter electrode to plate the electrically conductive material on the substrate.

Other objections and advantages of the present disclosure will become readily apparent to those skilled in this art from the following detailed description, wherein it is shown and described only the preferred embodiments simply by way of illustration of the best mode contemplated. As will be realized, the disclosure is capable of other and different embodiments, and its several details are capable of modifications in various obvious respects, without departing from the disclosure. Accordingly, the description is to be regarded as illustrative in nature and not as restrictive.

BRIEF DESCRIPTION OF DRAWINGS

The features of the disclosure believed to be novel and the elements characteristic of the invention are set forth with particularity in the appended claims. The figures are for illustration purposes only. The disclosure itself, however, both as to organization and method of operation, may best be understood by reference to the detailed description which follows taken in conjunction with the accompanying drawings in which:

BEST AND VARIOUS MODES

In order to facilitate an understanding of the present disclosure reference is made to the Figures.

Bearing in mind the problems and deficiencies of the prior art, the present disclosure provides a structure which makes it possible to reduce the occurrence of discontinuities within the metallization, such as voiding or seams, during electroplating at the edges of semiconductor metallization arrays across the wafer by using a metallization bar that is placed around the periphery of the semiconductor array. The metallization bar provides for improved uniform current distribution in the microcircuitry features across the entire array.

Figure 1:
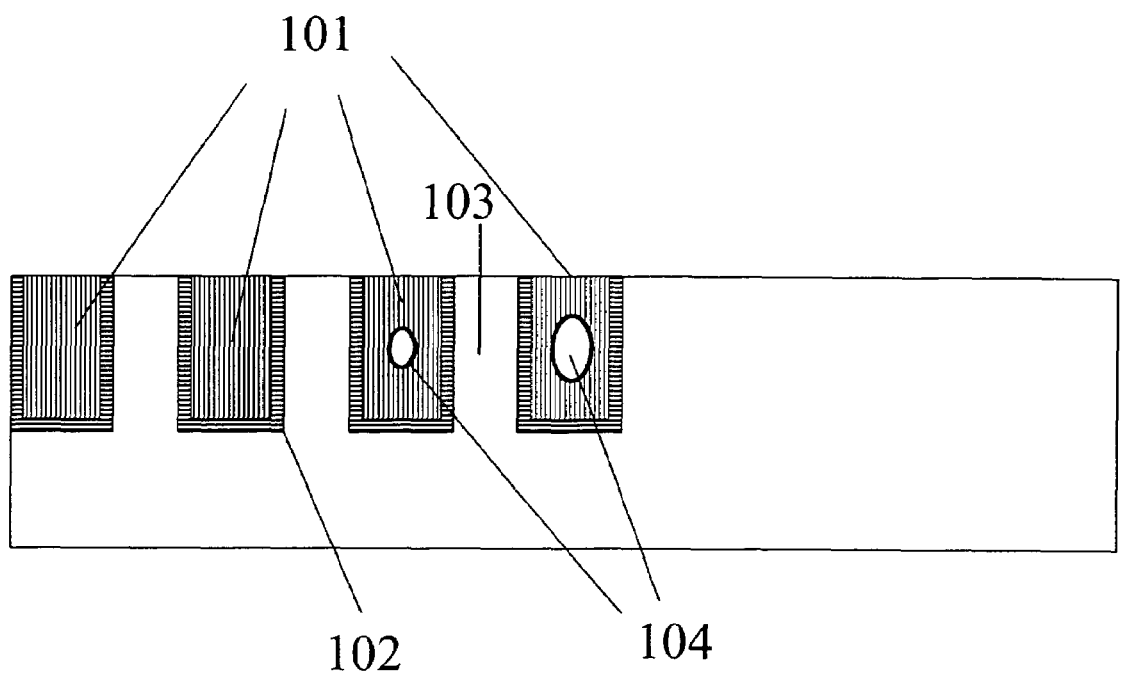
FIG. 1 is a schematic in cross-sectional view of the edge of a semiconductor array with voids induced during plating.
Figure 2:
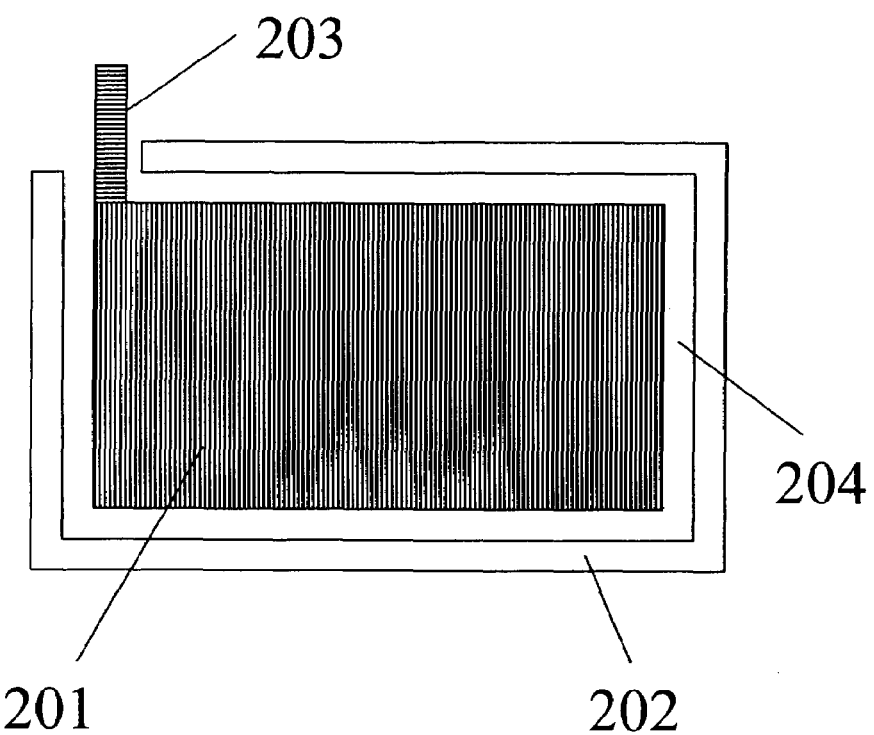
FIG. 2 is a schematic in top-down view of the semiconductor array with the peripheral bar according to the present disclosure.

FIG. 2 displays a top-down schematic of the entire semiconductor array (201) with a single metallization bar (202) running along the periphery of the array. By placing the metallization bar adjacent to the periphery of the array, the edge of the array does not possess as large of a discontinuity in the electrochemical potential as in the case when the bar is not present. The features at the array edge will effectively experience a potential similar to that in the center of the semiconductor array, for which plating conditions have been optimized, and thus a uniform current distribution is achieved for the whole semiconductor array. Typically, the peripheral bar has a width larger than that of the features in the semiconductor array so that the aspect ratio is sufficient to prevent voids from forming in the bar.

However, the width of the bar is typically kept small enough so that any impact on circuit design is negligible and generally is no larger than about 1 μm. Typically, the width of the bar is at least about 2 times larger than the width of the array lines If the array is electrically connected to other structures at a particular metallization level (203), then the bar typically contains a break around the periphery of the array but can be continuous around the periphery of the array on all other levels. In order to insulate the two metallization structures, a gap (204) containing the conventional dielectric material deposited during the normal manufacturing process exists.

Figure 3:
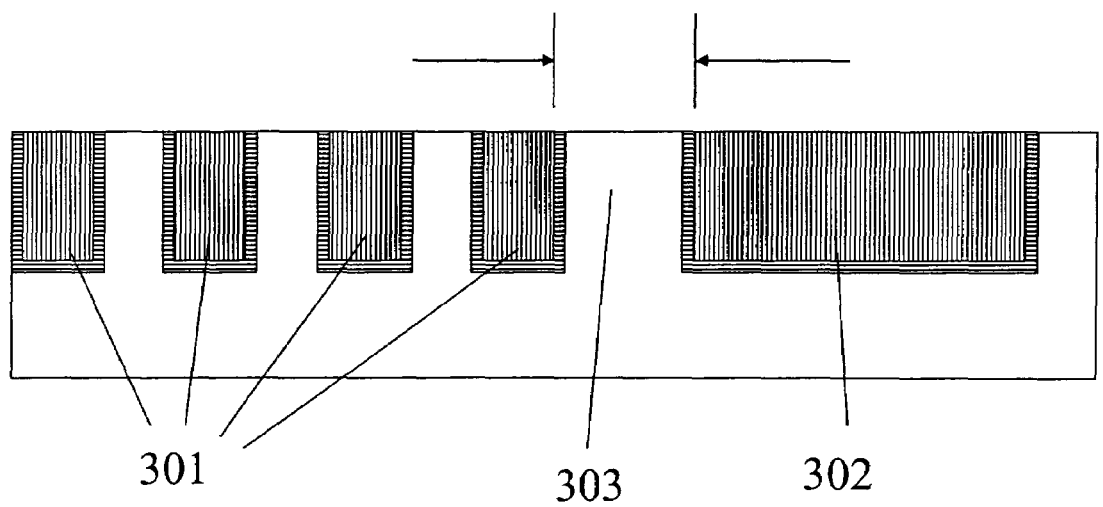
FIG. 3 is a cross-sectional view of the edge of the semiconductor array with the peripheral bar according to the present disclosure.

FIG. 3 illustrates a cross-sectional schematic of the edge of the semiconductor array (301) and the peripheral bar (302). The size of the gap (303) is chosen to minimize any parasitic capacitance that develops between the semiconductor array and the bar.

For instance, the gap is typically about 0.5 μm to about 2 μm in width and more typically about 1 μm to about 2 μm in width. Numerical modeling of the proposed structure indicates that a 1 micron gap between an array of 0.2 micron wide lines and a 0.5 micron peripheral bar increase the capacitance by approximately 2%. It should be understood that the above dimensions are exemplary of current metallization dimensions and could change to accommodate different dimensions. For instance, as appreciated by those skilled in the art, the metallization generally shrinks by about 30% every technology generation, which currently is introduced roughly every 12 to 18 months.

The thickness of the bar is typically, for purposes of convenience, about the same as the thickness of the array lines.

Also the metallization bar can be plated by the same step(s) as the semiconductor metallization. Accordingly, no additional processing steps would be needed. In addition, the conditions of the electroplating that have been optimized for plating across the entire wafer do not need to be altered.

Typically, the metallization structure or bar can be fabricated with the same materials used to form the semi-conductor metallization. The materials can include a barrier layer beneath the electrically conductive layer.

Examples of some barrier layers are examples of platable high resistive metal barrier layer are tantalum, tantalum nitride, titanium, titanium nitride, tungsten, tungsten nitride, ruthenium, ruthenium, rhenium, cobalt, molybdenum, chromium, mixtures thereof and alloys thereof. Further examples of platable high resistive metal barrier layers are iridium, platinum, gold, thallium, lead, bismuth, vanadium, chromium, cobalt, iron, nickel, copper, aluminum, silicon, carbon, germanium, gallium, arsenic, selenium, rubidium, strontium, yttrium, zirconium, niobium, rhodium, palladium, silver, cadmium, tin, antimony, tellurium, hafnium and osmium. The alloys of the above metals can include various alloying materials such as, but not limited to O, S, N, B and P. Also the barrier layer can comprise a plurality of layers of the same and/or different compositions.

The conductive material is typically Cu, Cu alloys, Al, Al alloys, Ag or Ag alloys and more typically Cu containing conductive materials(e.g. Cu and Cu alloys). Typically plating baths for Cu and Cu alloys are disclosed in US Patent Publication 2004/006948 A1, disclosure of which is incorporated herein by reference.

The peripheral bar can be included either at one level or multiple levels of semiconductor metallization. In a preferred embodiment, the bar would be used at the lowest levels of metallization, which generally exhibit the smallest feature widths or largest feature aspect ratios. Although the peripheral bar is not electrically active in the preferred embodiment, the peripheral bar can be made electrically active to serve as a monitor for crack propagation through the bar by probing its resistivity. In another alternate embodiment, the peripheral bar will be connected to the ground potential, which can assist in shielding the array from electrical signals passing through adjacent features.

The foregoing description illustrates and describes the disclosure. Additionally, the disclosure shows and describes only the preferred embodiments but, as mentioned above, it is to be understood that it is capable of use in various other combinations, modifications, and environments and is capable of changes or modifications within the scope of the invention concept as expressed herein, commensurate with the above teachings and/or the skill or knowledge of the relevant art. The embodiments described hereinabove are further intended to explain best modes known by applicant and to enable others skilled in the art to utilize the disclosure in such, or other, embodiments and with the various modification required by the particular applications or uses thereof. Accordingly, the description is not intended to limit the invention to the form disclosed herein. Also, it is intended that the appended claims be construed to include alternative embodiments.

All publication and patent applications cited in this specification are herein incorporated by reference, and for any and all purposes, as if each individual publication or patent application were specifically and individually indicated to be incorporated by reference.

Having thus described our invention, what we claim as new and desire to secure by Letters Patent is as follows:

1. A method for electroplating an array of electrically conductive material onto a conductive seed layer or directly onto a platable resistive metal barrier layer located on a substrate which comprises: plating a metallization bar on the substrate around the periphery where the array of electrically conductive material is to be located; wherein the bar contains a break around the periphery; contacting the substrate with a plating bath that optionally comprises a super filling additive and a suppressor, applying a current or voltage across electrodes, wherein the substrate acts as one electrode and a conductor acts as a counter electrode to plate the electrically conductive material on the substrate; and providing a gap of about 0.5 μm to about 2 μm in width between the metallization bar and array; wherein the array and bar are plated at the same time; wherein the bar has a width of about 1 μm or less and wherein the width of the bar is at least about 2 times larger than the width lines of the array; wherein the bar has a thickness that is substantially the same as the thickness of lines of the array; wherein the semi-conductor array and metallization bar have the same constituents; providing a barrier layer located beneath a conductive layer of the bar and array; and connecting the bar to a ground potential.

* * * * *